United States Patent
Suzuki

(10) Patent No.: US 10,246,793 B2
(45) Date of Patent: Apr. 2, 2019

(54) SEMICONDUCTOR MANUFACTURING METHOD AND SIC SUBSTRATE

(71) Applicant: FUJI ELECTRIC CO., LTD., Kawasaki-shi (JP)

(72) Inventor: Katsunori Suzuki, Matsumoto (JP)

(73) Assignee: FUJI ELECTRIC CO., LTD., Kawasaki-Shi (JP)

(*) Notice: Subject to any disclaimer, the term of this patent is extended or adjusted under 35 U.S.C. 154(b) by 0 days.

(21) Appl. No.: 15/476,327

(22) Filed: Mar. 31, 2017

(65) Prior Publication Data

US 2017/0204531 A1 Jul. 20, 2017

Related U.S. Application Data

(63) Continuation of application No. PCT/JP2016/001742, filed on Mar. 25, 2016.

(30) Foreign Application Priority Data

Apr. 17, 2015 (JP) .................................. 2015-085449

(51) Int. Cl.
  *C30B 23/02* (2006.01)
  *C30B 29/36* (2006.01)
  (Continued)

(52) U.S. Cl.
  CPC .......... *C30B 23/025* (2013.01); *C30B 25/186* (2013.01); *C30B 29/36* (2013.01);
  (Continued)

(58) Field of Classification Search
  CPC ............. C30B 23/025; H01L 29/66462; H01L 21/0243; H01L 29/205; H01L 29/2003;
  (Continued)

(56) References Cited

U.S. PATENT DOCUMENTS 5,185,290 A * 2/1993 Aoyagi ................... H01L 33/44
  148/DIG. 95
6,861,305 B2 * 3/2005 Koike ................... H01L 33/007
  257/E21.108
(Continued)

FOREIGN PATENT DOCUMENTS

JP 2007-182330 A 7/2007
JP 2007-529900 A 10/2007
(Continued)

OTHER PUBLICATIONS

Z. Zhang and T. S. Sudarshan. "Basal plane dislocation-free epitaxy of silicon carbide" Appl. Phys. Let. 87. 151913 (2005).
(Continued)

*Primary Examiner* — William Coleman
(74) *Attorney, Agent, or Firm* — Rabin & Berdo, P.C.

(57) ABSTRACT

A semiconductor device is provided in which a front surface of an SiC substrate is treated before epitaxial growth so as to reduce crystal defects such as stacking faults. In an aspect, an epitaxial layer is deposited on an SiC substrate in which a periodic texture is formed in a direction perpendicular to a <-1100> direction of the SiC substrate and in which an angle between a basal plane of the SiC substrate and a surface of the formed texture is smaller than an off angle.

10 Claims, 16 Drawing Sheets

(51) Int. Cl.
  *H01L 29/861* (2006.01)
  *C30B 25/18* (2006.01)
  *H01L 21/02* (2006.01)
  *H01L 29/04* (2006.01)
  *H01L 29/16* (2006.01)
  *H01L 29/06* (2006.01)
  *H01L 29/66* (2006.01)

(52) U.S. Cl.
  CPC .... *H01L 21/0243* (2013.01); *H01L 21/02378* (2013.01); *H01L 21/02433* (2013.01); *H01L 21/02529* (2013.01); *H01L 21/02634* (2013.01); *H01L 21/02658* (2013.01); *H01L 29/045* (2013.01); *H01L 29/0619* (2013.01); *H01L 29/1608* (2013.01); *H01L 29/861* (2013.01); *H01L 29/8613* (2013.01); *H01L 29/6606* (2013.01)

(58) Field of Classification Search
  CPC ......... H01L 29/66068; H01L 21/02458; H01L 21/02433; H01L 21/0262; H01L 29/1608; H01L 21/02378; H01L 29/267
  See application file for complete search history.

(56) References Cited

U.S. PATENT DOCUMENTS

| | | | |
|---|---|---|---|
| 8,823,015 B2* | 9/2014 | Momose | C30B 25/20 257/77 |
| 9,627,199 B2* | 4/2017 | Motayed | H01L 21/0259 |
| 9,988,738 B2 | 6/2018 | Tomita et al. | |
| 2008/0213536 A1 | 9/2008 | Maruyama et al. | |
| 2008/0318359 A1 | 12/2008 | Yonezawa et al. | |
| 2010/0199910 A1 | 8/2010 | Watanabe et al. | |
| 2015/0354090 A1 | 12/2015 | Tomita et al. | |

FOREIGN PATENT DOCUMENTS

| | | |
|---|---|---|
| JP | 2007-529901 A | 10/2007 |
| JP | 2008-311541 A | 12/2008 |
| JP | 2010-184829 A | 8/2010 |
| JP | 2012-153543 A | 8/2012 |
| WO | WO 2005-093795 A1 | 10/2005 |
| WO | WO 2005-095679 A2 | 10/2005 |
| WO | WO-2014/125550 A1 | 8/2014 |

OTHER PUBLICATIONS

Jun Taniguchi.Ch 3.1 "Three-dimensional mold"; Basis and technology development/application development of nanoimprint—Science and New Technology in Nanoimprint (ISBN4-902410-09-5); pp. 164-174; Frontier Publishing, Jul. 2006.

Chinese Office Action dated Aug. 28, 2018, with a machinery translation.

* cited by examiner

| | ANGLE BETWEEN BASAL PLANE AND TEXTURE SURFACE (θ-Φ) (°) | INCLINATION ANGLE Φ TO FRONT SURFACE OF SiC SUBSTRATE (°) | PITCH (nm) | INITIAL REVERSE LEAKAGE NON-DEFECTIVE RATE (%) | Vf DETERIORATION NON-DEFECTIVE RATE (%) | TOTAL NON-DEFECTIVE RATE (%) | EVALUATION |
|---|---|---|---|---|---|---|---|
| EXAMPLE 1 | 3 | 1 | 50 | 85 | 90 | 77 | ○ |
| EXAMPLE 2 | 2 | 2 | 50 | 89 | 95 | 85 | ◎ |
| EXAMPLE 3 | 1 | 3 | 50 | 84 | 98 | 82 | ◎ |
| EXAMPLE 4 | -2 | 6 | 50 | 88 | 91 | 80 | ◎ |
| EXAMPLE 5 | 1 | 3 | 20 | 88 | 85 | 75 | ○ |
| EXAMPLE 6 | 1 | 3 | 80 | 87 | 92 | 80 | ◎ |
| EXAMPLE 7 | 1 | 3 | 200 | 82 | 92 | 75 | ○ |
| COMPARATIVE EXAMPLE 1 | 4 | 0 | 50 | 85 | 60 | 51 | × |
| COMPARATIVE EXAMPLE 2 | 0 | 4 | 50 | 19 | 70 | 13 | × |
| COMPARATIVE EXAMPLE 3 | -3.5 | 7.5 | 50 | 40 | 65 | 26 | × |
| COMPARATIVE EXAMPLE 4 | -5 | 9 | 50 | 18 | 46 | 8 | × |
| COMPARATIVE EXAMPLE 5 | 1 | 3 | 300 | 50 | 90 | 45 | × |
| COMPARATIVE EXAMPLE 6 | 1 | 3 | 400 | 25 | 88 | 22 | × |

FIG.11

SEMICONDUCTOR MANUFACTURING METHOD AND SIC SUBSTRATE

CROSS-REFERENCE TO RELATED APPLICATIONS

This application is a continuation application of PCT application No. PCT/JP2016/001742 filed on Mar. 25, 2016 under 37 Code of Federal Regulation § 1.53 (b) and the PCT application claims the benefit of Japanese Patent Application No. 2015-085449 filed on Apr. 17, 2015, all of the above applications being hereby incorporated by reference wherein in their entirety.

BACKGROUND OF THE INVENTION

Field of the Invention

The present invention relates to a semiconductor manufacturing technique, and more specifically, to method of manufacturing a semiconductor device for treating a surface of an SiC substrate before epitaxial growth.

Description of the Related Art

In recent years, power semiconductors for power control or supply have been used in many fields such as electric and electronic equipment, home electric appliances, and electric cars. Many of the power semiconductors conventionally consist of Si (silicon) semiconductors. In recent years, much effort has been made to examine the use of SiC (silicon carbide) semiconductors that can withstand higher voltages than Si semiconductors and that enable, for example, a reduction in power loss and in the size of power converters. Many polytypes of SiC exist such as 3C-SiC that is a cubic system and 4H-SiC and 6H-SiC that are hexagonal crystal systems. Among these polytypes, 4H-SiC is typically used to produce practical SiC semiconductor devices.

FIG. 1 depicts an example of a conventional SiC_PN diode. An SiC_PN diode 100 in FIG. 1 includes a cathode electrode 101 formed of Ni, an n+ type SiC substrate 102 formed of a 4H-SiC crystal, and an n− type epitaxial layer (drift layer) 103 epitaxially grown on the SiC substrate 102 so as to have a film thickness corresponding to a withstand voltage. The SiC_PN diode 100 further includes JTE areas 104 and 105 formed on a front surface of the epitaxial layer 103 away from each other, a p+ layer 106 formed on the epitaxial layer 103 at a central portion thereof, an anode electrode 107 provided on the P+ layer 106 and formed of Ti/Al, and $SiO_2$ films 108 and 109 formed on the JTE areas 104 and 105, respectively, as insulating films. The SiC substrate 102 has a dielectric breakdown voltage that is 10 times as high as the dielectric breakdown voltage of an Si substrate to enable the film thickness of the epitaxial layer 103 to be reduced to 1/10 compared to Si. Consequently, the SiC substrate 102 allows implementation of a PN diode with a higher withstand voltage and a lower resistance than Si.

The SiC substrate 102, which is a single crystal substrate, includes crystal defects such as point defects and extended defects. The extended defects include threading screw dislocation (TSD), threading edge dislocation (TED), basal plane dislocation (BPD), and stacking fault (SF). These crystal defects (BPD and SF) are known to propagate from the SiC substrate 102 to the epitaxial layer 103.

FIG. 2 is a conceptual drawing illustrating a state where basal plane dislocation (BPD) has occurred inside the SiC substrate 102 in FIG. 1 and propagated to the epitaxial layer 103. The BPD has developed along a basal plane. The SiC epitaxial layer 103 is formed on the front surface of the SiC substrate 102 through crystal growth (step flow growth). At this time, the epitaxial layer 103 is grown on planes created by tilting the SiC substrate 102 through an angle of 10° to the basal plane so as to intentionally increase step density. The angle of the front surface tilted with respect to the basal plane 200 is designated as an off angle θ. A large number of BPDs occur inside the SiC substrate 102 and propagate to the epitaxial layer 103 grown on the front surface of the SiC substrate 102. The "basal plane" is a general term for planes perpendicular to a C axis of silicon carbide and includes a (0001) face (also referred to as an "Si face") and a (000-1) face (also referred to as a "C face"). Faces perpendicular to the a axis (an axis perpendicular to the C axis) of silicon carbide (faces parallel to the C axis) are generally referred to as "a faces". The a faces include, besides a (11-2) face, a (2-1-10) face, a (−12-10) face, a (−2110) face, a (−1-120) face, and a (1-210) face.

The BPDs propagated to the film of the epitaxial layer 103 cause stacking faults that are stable in terms of energy. Here, the stacking fault refers to a lattice fault formed by out-of-order stacking of atomic planes of the crystal. A typical stacking fault is a single Shockley stacking fault (SSF). The SSF refers to a structure in which one layer of stacking fault is inserted into a 4H-Si crystal (a hexagonal structure including four layers). The SSF behaves like a quantum well with respect to a <0001> direction of the 4H-SiC crystal and thus captures and traps electrons. In other words, the stacking fault acts as a lifetime killer to increase on resistance. When the SSF increases to make the resistance of the power semiconductor device high, a phenomenon occurs in which, with a constant voltage, a forward current decreases over time. The SSF occurs and grows using the BPD as a nucleus, and thus, a reduction in BPD is essential for suppressing an increase in SSF.

To reduce the BPD in the epitaxial layer 103, two methods have been proposed which are referred to as "low-off-angle growth during epitaxial deposition" and "KOH (potassium hydroxide) etching as a pretreatment for epitaxial growth" (for example, see Z. Zhang and T. S. Sudarshan. "Basal plane dislocation-free epitaxy of silicon carbide" Appl. Phys. Let. 87. 151913 (2005)).

In the former method, as is known, when the epitaxial layer is grown with the angle to the basal plane 200 (off angle θ) reduced, elastic energy needed to linearly grow the dislocation is calculated to have a very large value based on Expression (1).

$$W = \frac{E}{\cos\alpha} \qquad \text{Expression (1)}$$

Here, W denotes elastic energy needed to linearly grow the dislocation, and E denotes elastic energy of the fault, and α denotes an angle between a film growth direction and a dislocation line. The film growth direction coincides with a normal direction of the front surface of the substrate.

FIGS. 3A and 3B are diagrams illustrating a method for reducing the basal plane dislocation (BPD) based on the off angle. FIG. 3A illustrates a case of a large off angle, and FIG. 3B illustrates a case of a small off angle. As depicted in FIG. 3A, when the off angle θ is large and the angle α between the growth direction of the epitaxial layer and the dislocation line of the BPD is small, W is calculated to have a small value based on Expression (1). Consequently, the energy needed to extend the basal plane dislocation is low, facilitating growth of the basal plane dislocation in the epitaxial layer 103.

In contrast, when the off angle θ is small and the angle α is large as depicted in FIG. 3B, W is calculated to have a large value based on Expression (1). Consequently, the energy needed to extend the basal plane dislocation is high, hindering growth of the basal plane dislocation in the epitaxial layer 103. When the off angle θ is small, the probability that the BPD present in the SiC substrate 102 is converted into TED (Threading Edge Dislocation) increases, enabling a reduction in faults resulting from the BPD in the epitaxial layer 103. Compared to the BPD, the TED less seriously affects the SiC semiconductor device. Thus, reducing the BPD is important.

In the latter method in Z. Zhang and T. S. Sudarshan. "Basal plane dislocation-free epitaxy of silicon carbide" Appl. Phys. Let. 87. 151913 (2005), as is known, the BPD can be selectively etched, and thus, the off angle can be made locally small, preventing the BPD from growing during the subsequent epitaxial growth.

However, in the former method, a simple attempt to reduce the off angle θ suppresses step growth during the epitaxial growth, making crystal growth based on two-dimensional random nucleation dominant. Thus, disadvantageously, no high-quality 4H-SiC crystal is obtained. Further, disadvantageously, step bunching is formed on the front surface of the epitaxial layer 103. Here, the step bunching refers to a phenomenon in which, during the process of the epitaxial growth, each atomic layer grows transversely with respect to a growth direction of the atomic layer, so that growth steps at ends of the atomic layers are united together under a certain condition, resulting in a significantly irregular front surface of the epitaxial layer 103.

Furthermore, in the latter method, the KOH etching with growth of the BPD inhibited involves a large etching depth of 7 μm. This corresponds to 70% of the film thickness of 10 μm of the epitaxial layer 103 at which the epitaxial layer 103 can withstand a voltage of 1.2 kV. In manufacture of the semiconductor device, such a local variation in film thickness reduces the withstand voltage in some areas of the semiconductor device, making the manufacturing process for the semiconductor device invalid. Moreover, the use of KOH leads to alkali contamination of the device. For these reasons, it is disadvantageously difficult to adopt application of the KOH etching treatment to the SiC substrate 102 before epitaxial growth, as an industrial process.

SUMMARY OF THE INVENTION

An object of the present invention is to provide a semiconductor device in which a front surface of an SiC substrate is treated before epitaxial growth so as to reduce crystal defects such as stacking faults.

To accomplish such an object, the present invention is characterized in that an epitaxial film is deposited on an SiC substrate in which a periodic texture is formed in a direction of the SiC substrate perpendicular to a <-1100> direction and in which an angle between a basal plane of the SiC substrate and a surface of the formed texture is smaller than an off angle.

This configuration enables a reduction in the BPD density in the epitaxial film and a reduction in the number of stacking faults resulting from current application, allowing inhibition of a phenomenon, with a constant voltage, a forward current decreases over time.

Further features of the present invention will become apparent from the following description of exemplary embodiments with reference to the attached drawings.

BRIEF DESCRIPTION OF THE DRAWINGS

FIG. 11 is a table indicating results for examples and comparative examples in the present invention.

DESCRIPTION OF THE EMBODIMENTS

Embodiments of the present invention will be described below in detail with respect to the drawings.

Figure 1:
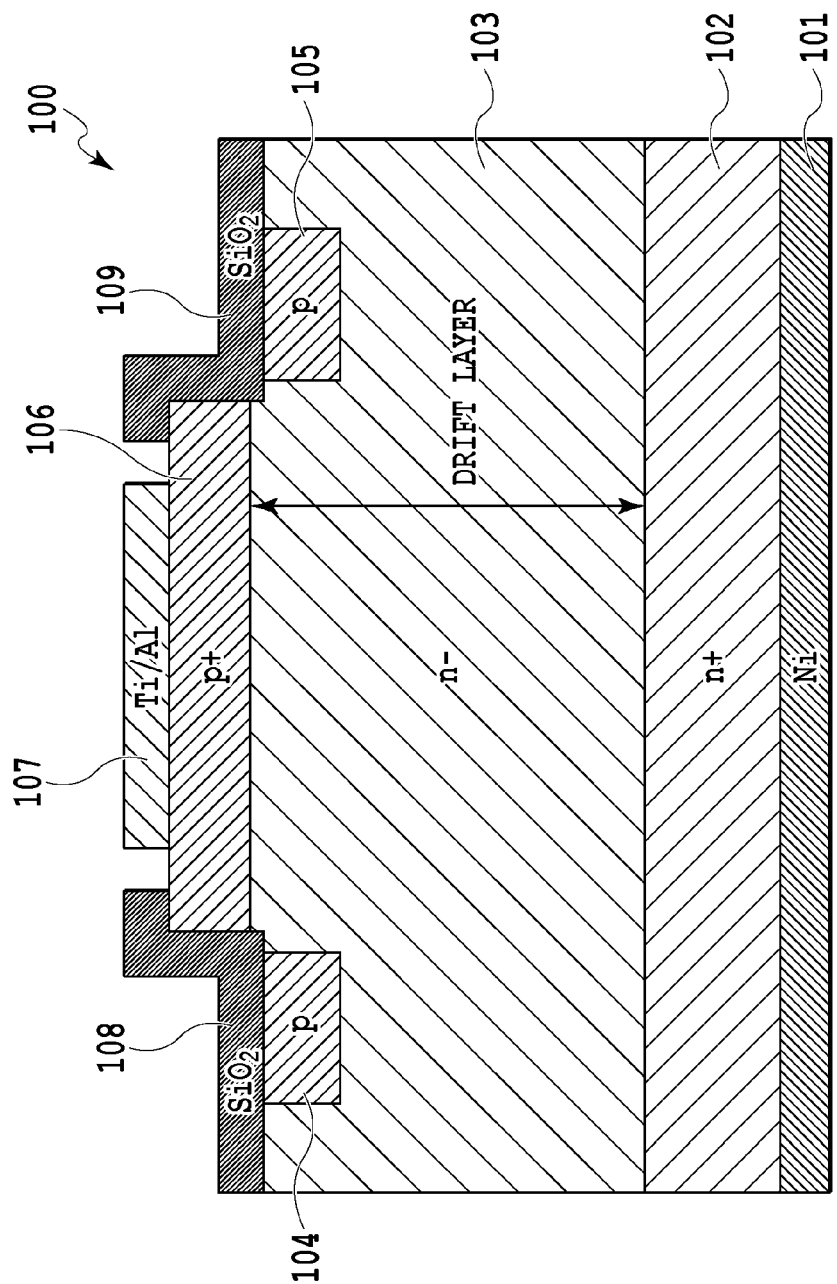
FIG. 1 is a diagram depicting an example of a conventional SiC_PIN diode.
Figure 2:
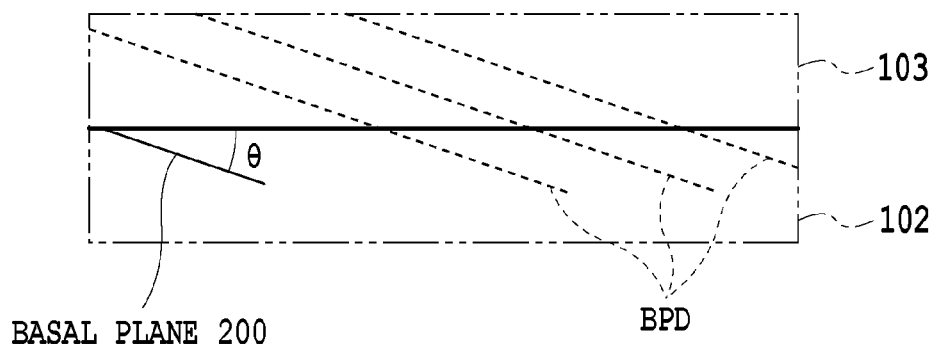
FIG. 2 is a conceptual drawing illustrating that a basal plane dislocation (BPD) propagates to an epitaxial layer.
Figure 3A:
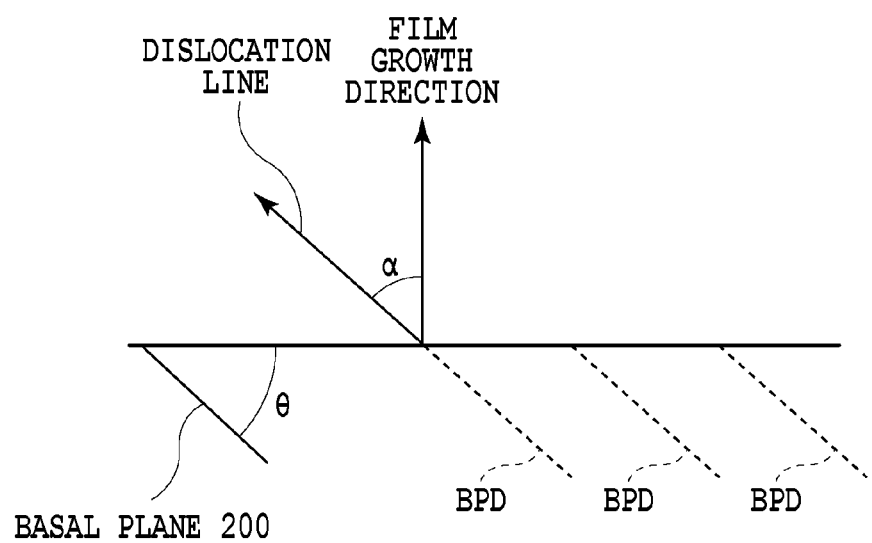
FIG. 3A is a diagram illustrating a method for reducing the basal plane dislocation (BPD) based on an off angle in a case where an off angle is large.
Figure 3B:
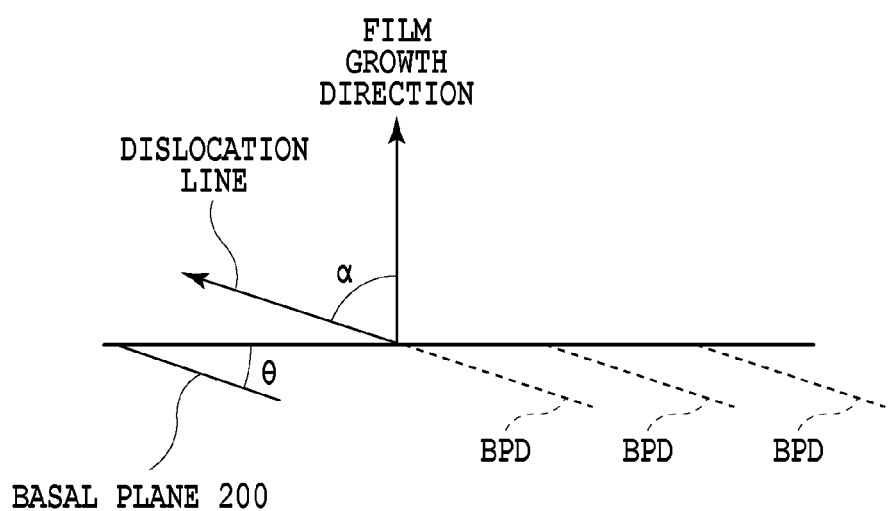
FIG. 3B is a diagram illustrating a case where the off angle is small.
Figure 4:
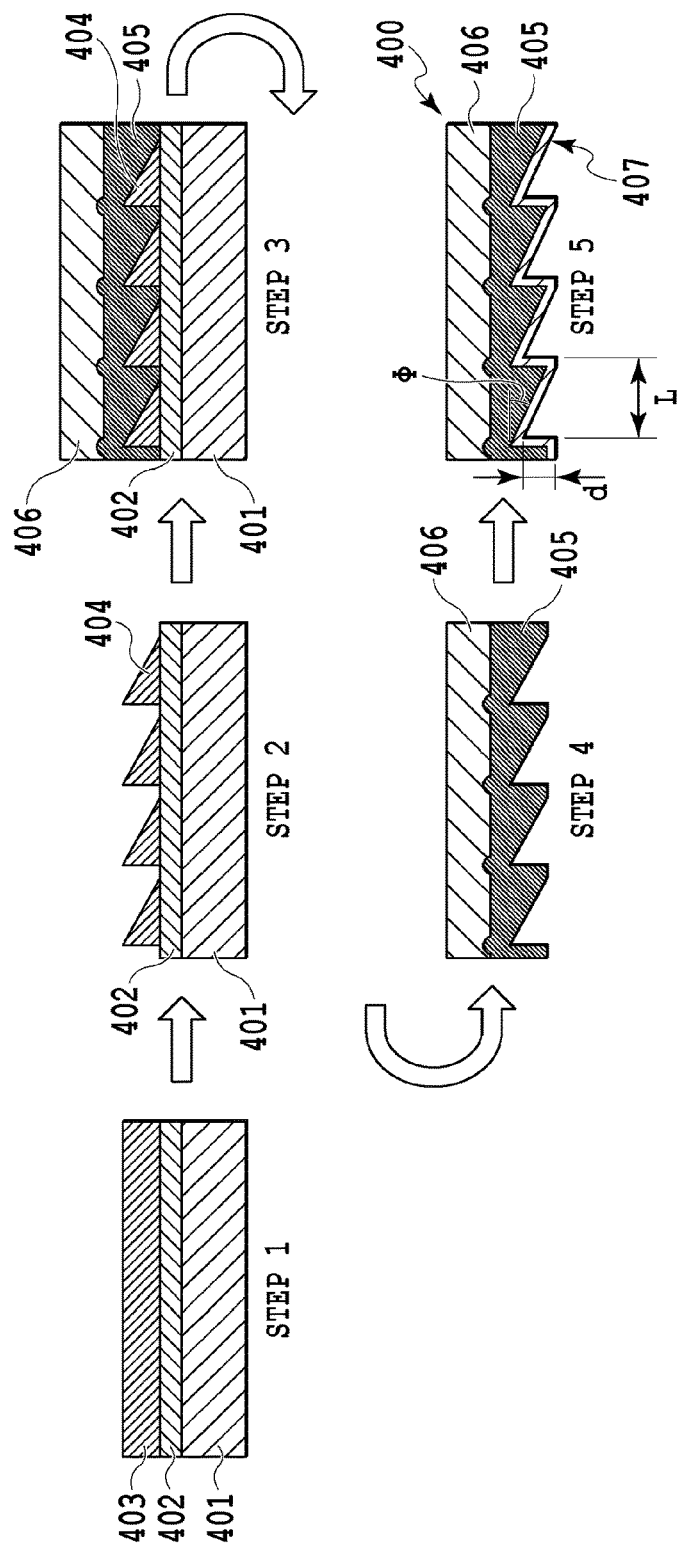
FIG. 4 is a diagram illustrating a production method for a polishing material for an SiC substrate according to an embodiment of the present invention.

FIG. 4 is a diagram illustrating a production method for a polishing material for an SiC substrate according to an embodiment of the present invention. A polishing material 400 is a processing tool having a catalytic action and used to process the surface of the SiC substrate.

In step 1, a Cr film 402 is deposited on the glass substrate 401, and a resist 403 is coated on the Cr film 402. Examples of the deposition method for the Cr film 402 include deposition, ion beam deposition, and sputtering. However, only a low adhesion strength is achieved simply by deposition, and thus, ion beam deposition or sputtering is preferably used. The resist 403 coated on the Cr film 402 may be a resist such as OEBR-1000 manufactured by TOKYO OHKA KOGYO CO., LTD., which deals with electron beams. The resist 403 preferably has a film thickness of 1 μm or more and 3 μm or less. OEBR-1000 taken as an example is positive, but a negative resist may also be used.

In step 2, resist patterning is executed in which the resist 403 is exposed with the dose of electron beams varied. In this case, an accelerating voltage is within the range from 20 to 70 keV, and the dose is within the range from 2 μC/cm² to 200 μC/cm². The patterning is executed such that, in a section depicted in FIG. 4, the resist 403 has a sawteeth sectional shape in which the ridges and valleys form lines parallel to a direction perpendicular to the sheet of the drawing. That is, the polishing material 400 forms a line pattern including a plurality of parallel lines as viewed from the resist 403. The dose is continuously varied in a direction perpendicular to the lines and is kept constant in a direction along the lines. Subsequently, annealing is executed at 150° C. for approximately 30 minutes, and the resist is stripped using a release agent compatible with the resist 403. This enables production of a resist shape 404 with an inclination angle ϕ controlled. As described above, the resist shape 404 is formed which corresponds to the desired line pattern and sectional shape.

In step 3, a seed layer 405 of Ni or NiP is deposited by sputtering. The seed layer 405 preferably has a film thickness of approximately 100 nm. Subsequently, an Ni plate 406 is formed on the seed layer 405 by electroplating. The plate thickness of the Ni plate 406 needs to be 100 μm or more so as to make the Ni plate 406 strong enough to avoid being deformed by the weight of the Ni plate 406 and 700 μm or less because a small board thickness is preferable in terms of manufacturing costs and manhour.

In step 4, the Ni plate 406 is stripped from the glass substrate 401 with the resist of the resist shape 404.

In step 5, a surface coat layer is formed. On the resist shape 404 side of the Ni plate 306, Pt 407 forming a surface coat layer is deposited to a thickness of 5 nm to 30 nm by sputtering and ion coat deposition. This is because the thickness needs to be 5 nm or more to allow the Pt 407 to be uniformly deposited so as to achieve appropriate coverage and to be 30 nm or less so as to avoid a dull pattern shape. These steps allow the polishing material 400 with a catalytic action to be completed.

Figure 7A:
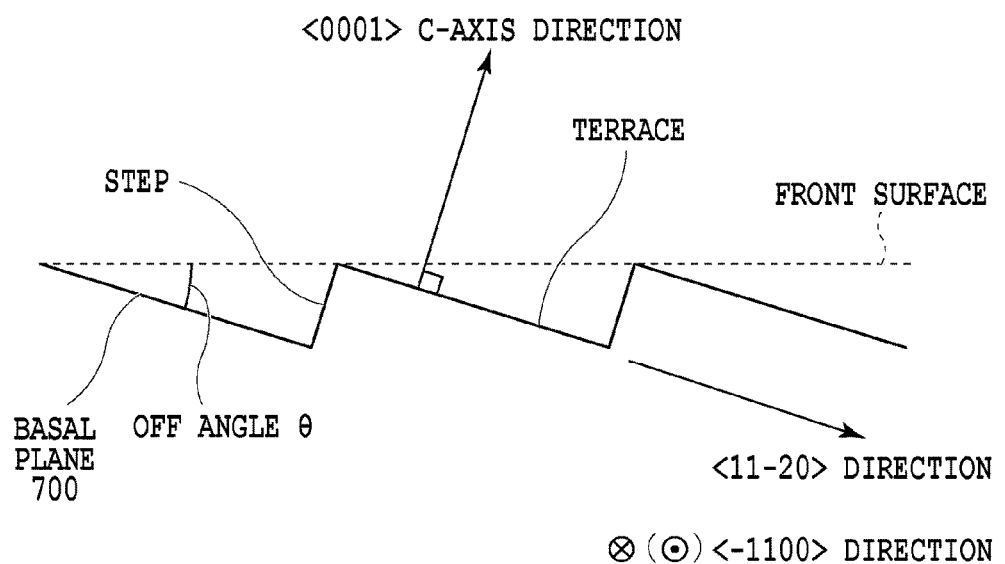
FIG. 7A is a schematic diagram depicting the details of a surface shape of the SiC substrate before and after processing according to a processing method for an SiC substrate according to an embodiment of the present invention.
Figure 7B:
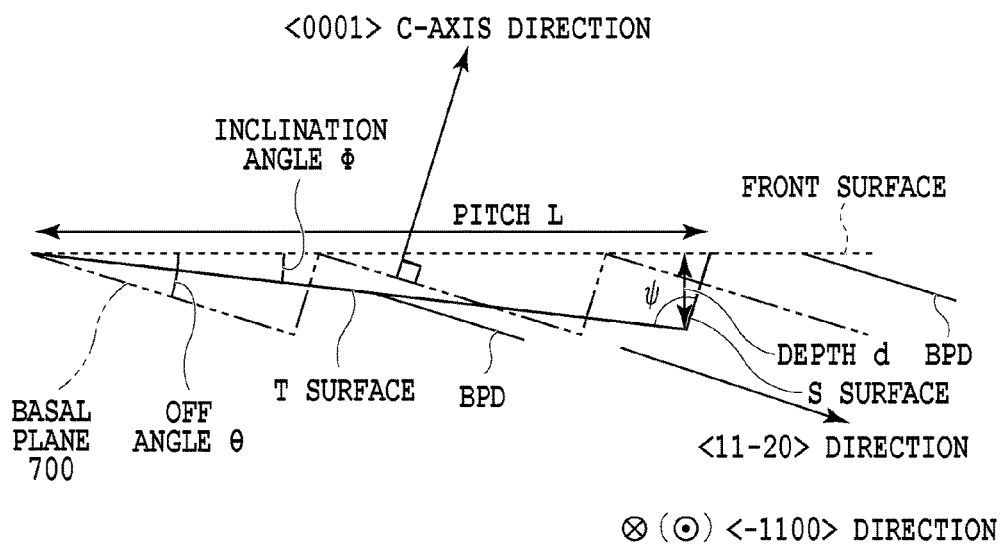
FIG. 7B is a diagram depicting the surface shape of the processed SiC substrate.

Consequently, as depicted in FIGS. 7A and 7B described below, a polishing tool is formed in which the front surface of the SiC substrate has the desired line pattern and the sectional shape (inclination angle ϕ, depth d, pitch L).

In the sectional shape of the polishing tool, the difference between the off angle θ and the inclination angle ϕ. The depth d is preferably 15 nm or less and more preferably 10 nm or less. The depth d needs to be 3 nm or more in view of stable quality and costs. The pitch L is 20 nm or less, preferably 200 nm or less, and more preferably 100 nm or less in view of stable quality and costs. A pitch L of longer than 200 nm hinders appropriate step-terrace growth, leading to growth of a different polytype. Furthermore, a long pitch results in the presence of steps on the surface of the crystal, and during crystal growth, step bunching is likely to occur in which the step rows are bunched into gigantic steps.

Figure 5A:
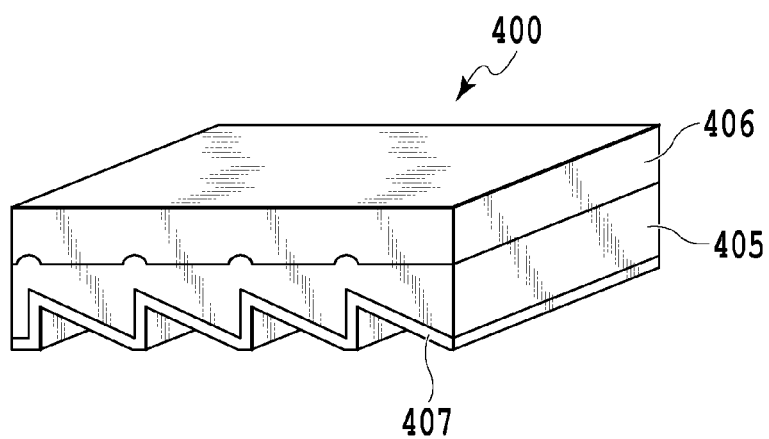
FIG. 5A is a diagram depicting a polishing material according to an embodiment of the present invention.
Figure 5B:
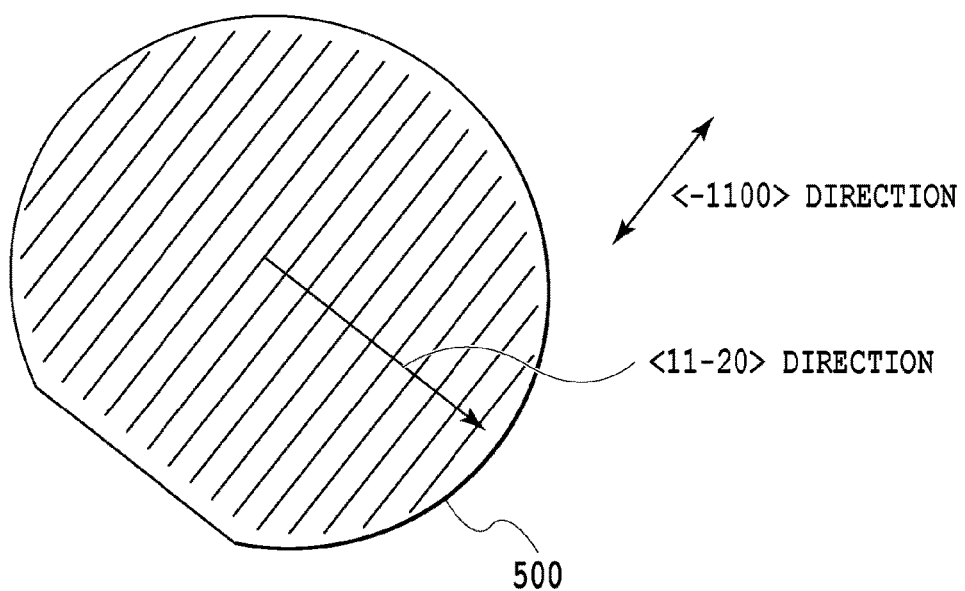
FIG. 5B is a diagram depicting an SiC substrate according to an embodiment of the present invention.

FIG. 5A depicts a polishing material according to an embodiment of the present invention. FIG. 5B is a diagram depicting an SiC substrate according to an embodiment of the present invention. Using FIGS. 5A and 5B, a processing method for the SiC substrate before epitaxial growth using the polishing material 400 in FIG. 4 will be described.

First, a 4H-SiC substrate 500 of a hexagonal crystal system with an off angle θ=4° is prepared. A texture can be more easily applied to substrates with higher flatness, and thus, the 4H-SiC substrate preferably has a surface roughness Ra of 0.7 nm or less. The surface roughness is more preferably equal to or lower than 0.5 nm. However, the off angle θ of the 4H-SiC substrate 500 used is not limited to 4° but is desirably 0° or more and less than 10°. If the off angle of the 4H-SiC substrate 500 is 0°, a front surface of the 4H-SiC substrate 500 is parallel to a basal plane. Thus, the direction of BPD is also present inside the 4H-SiC substrate 500 parallel to the front surface of the 4H-SiC substrate 500. Therefore, the BPD originally infrequently propagates to the epitaxial layer. On the other hand, as described above, if the off angle θ=0°, crystal growth based on two-dimensional random nucleation is dominant, disadvantageously preventing a high-quality 4H-SiC crystal from being obtained. However, formation of a periodic texture as described below enables appropriate step-terrace growth to be implemented, allowing for the use of a substrate with an offset angle θ=0°.

Then, a liquid measure of (3 cc or more) hydrofluoric acid is dropped so as to spread all over the front surface of the 4H-SiC substrate 500. Then, the polishing material 400 is pressurized so as to be able to come into uniform contact with the front surface of the 4H-SiC substrate 500 with the hydrofluoric acid spread thereon. The polishing material 400 is preferably pressurized at a total of five points including the center of a mold and four points corresponding to 90° intervals of a concentric circle 1 cm inward from an outer circumference of the mold to allow the polishing material 400 and the front surface of the 4H-SiC substrate 500 to uniformly contact each other.

The pressure is preferably 5 g/cm² or more and 200 g/cm². In this state, the polishing material 400 and the 4H-SiC substrate 500 are installed such that a line pattern on the polishing material 400 and a <11-20> direction of a 4H-SiC crystal in the 4H-SiC substrate 500 align with the vertical direction. That is, the polishing material 400 and the 4H-SiC substrate 500 are installed such that the line pattern is parallel to a <-1100> direction of the 4H-SiC crystal. The polishing material 400 is reciprocated with the direction parallel to the line pattern on the polishing material 400 set to be a processing direction. The speed of the reciprocation is preferably within the range from 1 mm/sec to 100 mm/sec. Such polishing allows the Pt 407, which serves as the surface coat layer, to act as a catalyst to polish the front surface of the 4H-SiC substrate 500 without any polishing material. This is not physical processing but chemical processing using the catalytic action, and thus, once the polishing material 400 is produced, 100 or more substrates can be treated. The surface coat layer is not limited to the Pt 407, but a rare metal material can be used such as Ir, Re, Pd, Rh, Os, Au, or Ag. Diamond abrasive grains or the like may be applied to add mechanical action to the processing.

With the processing method in the present embodiment and the 4H-SiC substrate 500 processed using the processing method, the front surface of the 4H-SiC substrate 500 can be mostly formed into a low-off-angle area, enabling a reduction in BPD, which serves as a nucleus for growth of stacking faults. At this time, a line pattern with predetermined steps and a predetermined pitch and a sectional shape need not be continuously formed all over the front surface of the 4H-SiC substrate (wafer) 500 but may be discontinuously formed. Very small steps formed on the front surface of the 4H-SiC substrate 500 in the present embodiment do not form electric field concentration points that may deteriorate the characteristics of the device. Moreover, the growth rate of the epitaxial film is prevented from being significantly reduced compared to the growth rate in the conventional technique due to the presence of a large number of steps and a large number of epitaxial growth points on the 4H-SiC substrate 500.

Figure 6A:
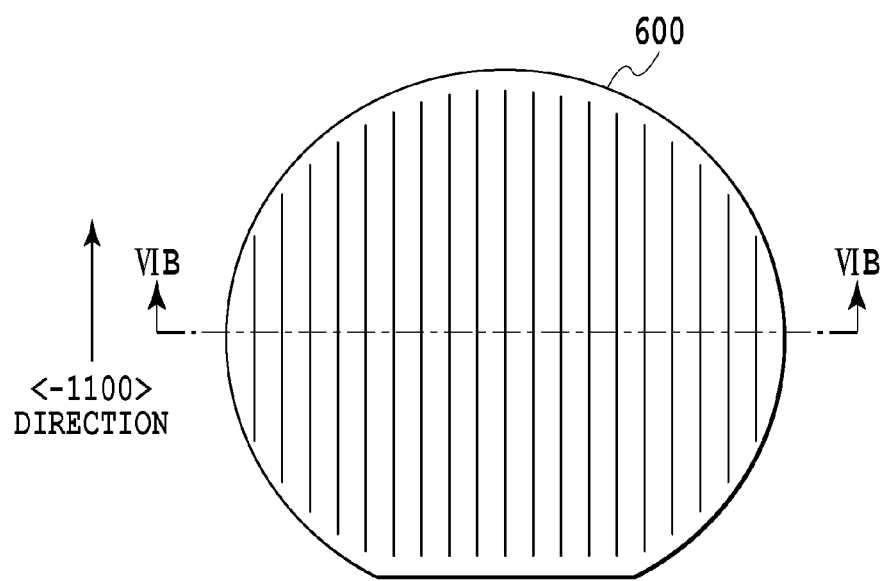
FIG. 6A is a plan view of a processed SiC substrate illustrating a processing method for an SiC substrate according to an embodiment of the present invention.
Figure 6B:
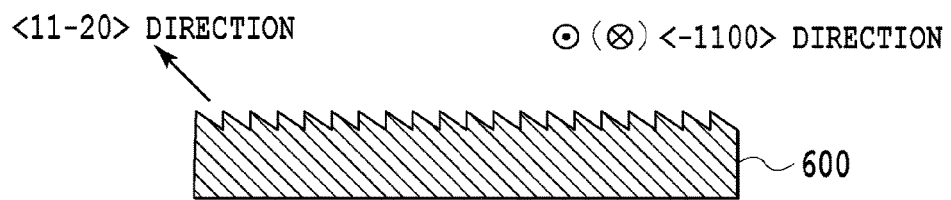
FIG. 6B is a sectional view of the SiC substrate taken along a profile line VIB-VIB in FIG. 6A.

FIGS. 6A and 6B are diagrams depicting an SiC substrate processed using a processing method for an SiC substrate according to an embodiment of the present invention. FIG. 6A depicts a plan view of a processed SiC substrate 600. FIG. 6B depicts a sectional view of the SiC substrate 600 taken along line VIB-VIB in FIG. 6A. As depicted in FIG. 6A, a line pattern-like texture is formed on the front surface of the SiC substrate 600 in the <-1100> direction of the 4H-SiC crystal in the SiC substrate 600. Furthermore, as depicted in FIG. 6B, an inclination angle to the front surface of the SiC substrate 600 is formed on the front surface of the SiC substrate 600 along the sectional shape. The direction of oblique lines on the SiC substrate 600 in FIG. 6B represents the <11-20> direction, which is perpendicular to the <-1100> direction of the 4H-SiC crystal.

FIGS. 7A and 7B are schematic diagrams depicting the details of the surface shape of the SiC substrate before and after processing using a processing method for an SiC substrate according to an embodiment of the present invention.

FIG. 7A is a diagram depicting the surface shape of the unprocessed SiC substrate 600. On the unprocessed SiC substrate 600, a step-terrace structure inclined at the off angle θ to the basal plane 700 is formed. A "front surface" depicted by a dotted line represents the front surface obtained when the wafer is macroscopically viewed. The off angle θ is an angle subtended between the basal plane 700 of the SiC substrate 600 and the front surface of the SiC substrate 600. According to Expression (1), the propagation of BPD to the epitaxial layer decreases consistently with the off angle θ. However, a small offset angle θ is likely to cause step bunching. That is, the step-terrace growth, which is a two-dimensional growth, is prevented, and three-dimensional growth occurs. Thus, the processing method in the present embodiment is used to form a periodic groove so as to set the difference between an inclination angle φ to the front surface of the SiC substrate 600 and the off angle θ of the SiC substrate 600 to a smaller angle (3° or less).

FIG. 7B is a diagram depicting the surface shape of the SiC substrate 600 processed using the processing method in the present embodiment. On the front surface of the processed SiC substrate 600, a texture is formed which has a T surface inclined at the inclination angle φ to the front surface and an S surface inclined at a valley angle ψ to the T surface. The illustrated inclination angle φ is smaller than the off angle θ to the basal plane 700 of the SiC substrate 700. However, the present embodiment is not limited to this. The inclination angle φ may be larger than the off angle θ. Furthermore, in the texture of the SiC substrate 600, a groove defined by the T surface and the S surface has a distance (pitch L) in a direction perpendicular to the <-1100> direction of the SiC substrate, and a vertical distance (depth d) is present between the front surface of the SiC substrate 600 and a tangent between the T surface and the S surface forming the valley angle ψ. Moreover, the valley angle ψ is preferably 90°+|θ−φ|. This is because the S surface is parallel to a <0001> C-axis direction, allowing for the appropriate step-terrace growth, as depicted in FIG. 7B. Here, the T surface is referred to as a texture surface. FIG. 7B is schematic and is not to scale. The step-terrace structure depicted by an alternate long and two short dashes line is actually smaller than a solid line formed by the texture. FIG. 7B schematically illustrates that a microscopic view of the T surface corresponds to the step-terrace structure as depicted by the alternate long and two short dashes line.

Figure 8:
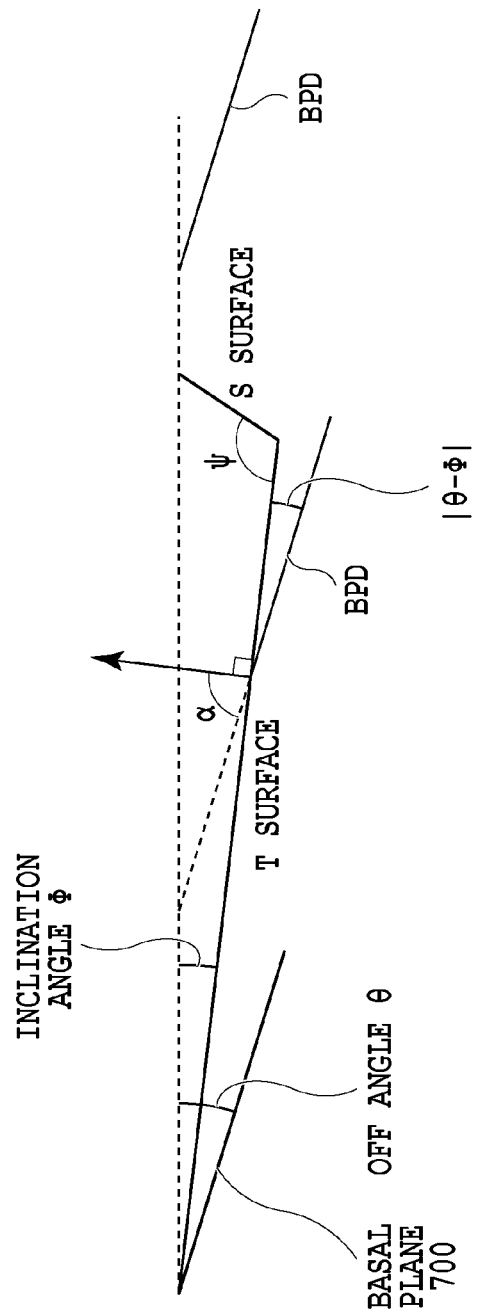
FIG. 8 is a schematic diagram depicting the details of a texture formed on a front surface of the SiC substrate according to an embodiment of the present invention.
Figure 9:
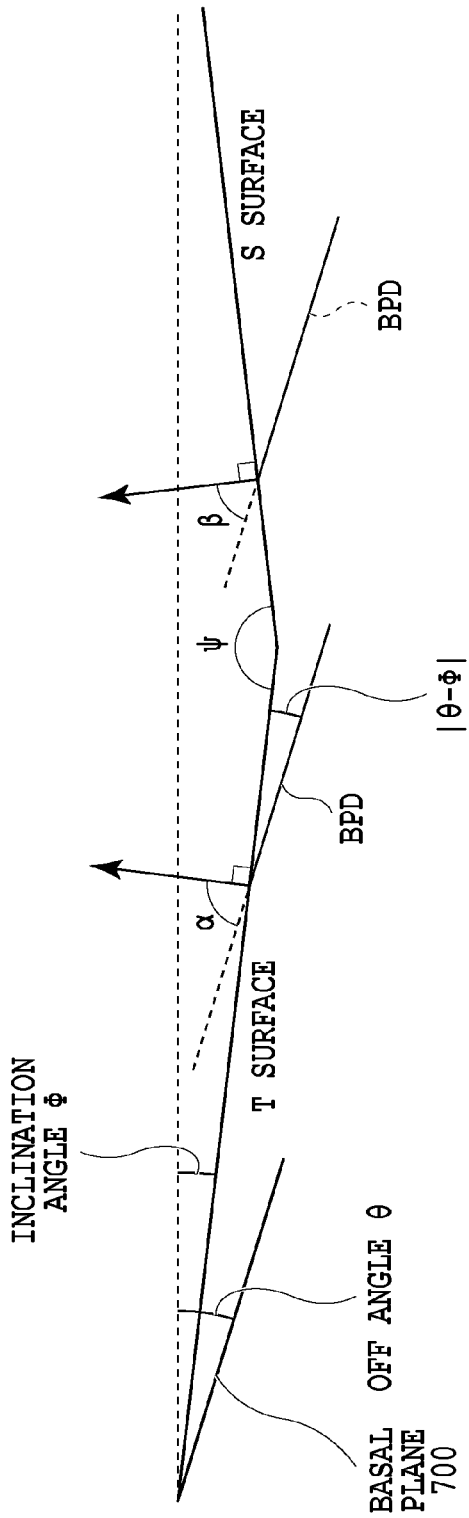
FIG. 9 is a schematic diagram depicting the details of a texture formed on the front surface of the SiC substrate according to another embodiment of the present invention.
Figure 10:
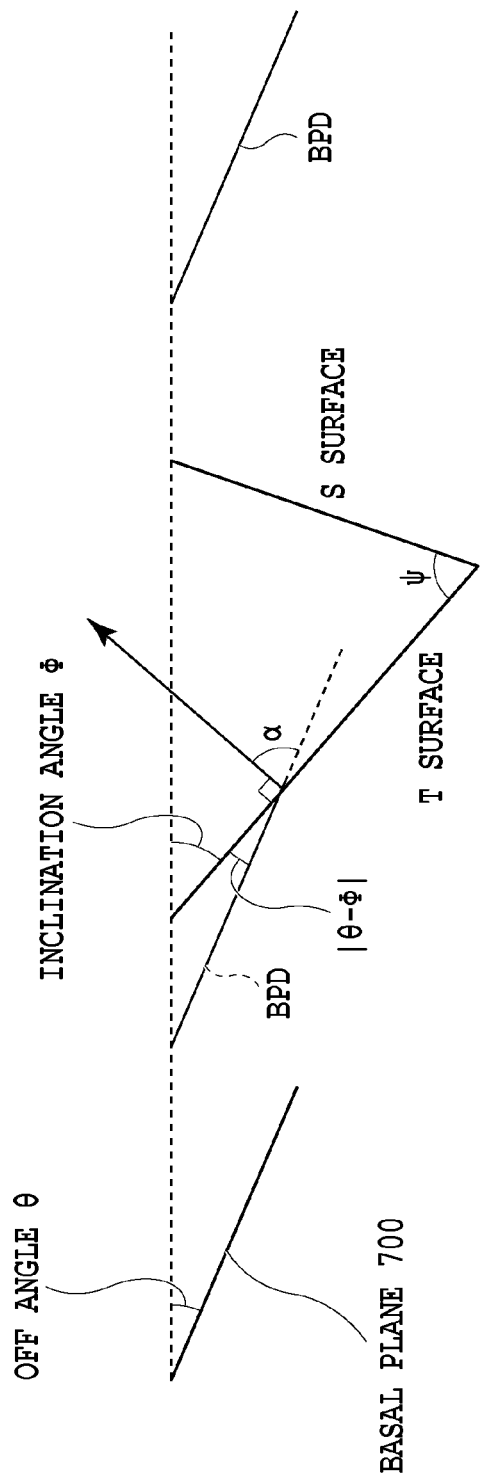
FIG. 10 is a schematic diagram depicting the details of a texture formed on the front surface of the SiC substrate according to yet another embodiment of the present invention.

FIGS. 8 to 10 are schematic diagrams depicting the details of a texture formed on the front surface of the SiC substrate according to an embodiment of the present invention. FIG. 8 is a diagram illustrating a case where a texture is formed which has a T surface inclined at an inclination angle φ smaller than the off angle θ to the front surface of the SiC substrate 600 and an S surface inclined at the valley angle γ to the T surface. In this case, a large angle α is subtended between the normal direction of the T surface, which is larger than the S surface, and a dislocation line of the BPD, making the dislocation of the BPD unlikely to propagate to the epitaxial layer. Consequently, upon reaching the T surface, the BPD is prevented from growing, leading to a reduction in the growth of the BPD. Since the S surface is smaller than the T surface, the probability that the BPD reaches the S surface is low.

FIG. 9 is a diagram depicting a case where a texture in which the T surface and the S surface are similar in size is formed on the front surface of the SiC substrate 600. In this case, large angles α and β are subtended between the dislocation line of the BPD and the normal directions of the T surface and the S surface, respectively. Thus, the dislocation of the BPD is unlikely to propagate to the epitaxial layer, enabling a reduction in the growth of the BPD.

FIG. 10 is a diagram illustrating a case where a texture is formed which has a T surface inclined at an inclination angle φ larger than the off angle θ to the front surface of the SiC substrate 600 and an S surface inclined at the valley angle ψ to the T surface. Also in this case, a large angle α is subtended between the normal direction of the T surface and the dislocation line of the BPD, making the dislocation of the BPD unlikely to propagate to the epitaxial layer, as is the case with FIG. 8. Consequently, upon reaching the T surface, the BPD is prevented from growing, leading to a reduction in the growth of the BPD.

In other words, when a surface of a new texture is formed with respect to the dislocation line of the BPD, stacking dislocation can be reset, allowing the BPD to be prevented from propagating to the epitaxial layer. This configuration utilizes the characteristic that a small angle (|θ−φ|) subtended between the dislocation line of the BPD and the surface of the texture makes the dislocation of the BPD unlikely to propagate to the epitaxial layer.

Now, a manufacturing method for an SiC_PN diode using the processed SiC substrate 600 will be described by way of example.

An SiC epitaxial film appropriate for a withstand voltage is deposited on the processed SiC substrate 600. For a withstand voltage of 600 V, the film thickness may be approximately 5 μm, and for a withstand voltage of 1200 V, the film thickness may be approximately 10 μm. Recesses and protrusions are formed on the front surface of the SiC substrate 600 as a result of epitaxial deposition. To flatten the front surface, CMP treatment may be executed. In this case, the preferable flatness corresponds to Ra of 0.7 nm or less. This is because significant recesses and protrusions may form leakage points.

When an SiC_PN diode is produced by a well-known method using the SiC substrate 600 produced under the above-described conditions, a phenomenon in which, with a constant voltage, a forward current decreases over time can be inhibited without affecting mass productivity. The use of the manufacturing method in the present embodiment enables mass production of high-quality SiC_PN diodes and MOSFETs at reduced costs. In the present embodiment, the polishing material is produced, and the surface shape of the SiC substrate is processed by the processing method using the polishing material. However, the processing method for the surface shape is not limited to this.

Examples

For the processing method for the surface shape of the SiC substrate in the present embodiment, experiments were conducted with a surface processing pattern varied, and SiC_PN diodes with a 1200V class withstand voltage were produced using the SiC substrate.

FIG. 11 illustrates dimensions (the angle between the basal plane and the texture surface, the inclination angle, and the pitch) of SiC substrates and results for an initial reverse leakage non-defective rate, a forward current (Vf) deterioration non-defective rate, and a total non-defective rate for SiC-PN diodes manufactured to have these dimensions. The initial reverse leakage non-defective rate is the rate of acceptable diodes that involve a reverse leakage current of 1 µA or less when a voltage of 1300 V is applied to the diode. The forward voltage (Vf) deterioration non-defective rate is the rate of acceptable diodes involving a Vf (forward voltage) fluctuation rate of 5% or less when the diodes were tested at 125° C. for 2000 hours using If (average forward current) of −8 A. The valley angle ψ was set to 90°+|θ−φ|. For the total non-defective rate for the initial reverse leakage non-defective rate and the forward voltage (Vf) deterioration non-defective rate, a rate of 80% or more is indicated by a double circle, a rate of 70% or more and less than 80% is indicated by a circle, and a rate of less than 70% is indicated by a cross.

The results of Examples 1 to 4 and Comparative Example 1 in FIG. 11 indicate that setting the angle between the basal plane of the SiC substrate and the texture surface to 3° or less is preferable. The results are expected to be due to an increase in the probability that the BPD, which is a nucleus of a stacking fault, is converted into a TPD, reducing the BPD in the epitaxial film. The results indicate that the same effect is produced even when the inclination angle φ is larger than the off angle θ. For the results of Comparative Example 2 in which the texture surface is parallel to the basal plane, the two-dimensional growth of the epitaxial layer is expected to be prevented during the epitaxial growth of the epitaxial film, leading to a reduced non-defective rate.

The results of Examples 3, 5, 7 and Comparative Examples 5, 6 indicate that the pitch is preferably 200 nm or less and more preferably 100 nm or less. This is because a large pitch prevents the two-dimensional growth of the epitaxial film, making the uniformity of the epitaxial film difficult to achieve. A pitch of 100 nm or less improves film quality and increases a deposition rate. However, an excessively small pitch makes the epitaxial film less effective for resetting the BPD. Furthermore, the depth is excessively small, and thus, a pattern of a mold is not precisely reflected in the SiC surface, leading to a reduced total non-defective rate. Therefore, the pitch is preferably 30 nm or more and less than 50 nm.

The above-described experimental results indicate that the use of the SiC substrate formed of the 4H-SiC crystal enables production of SiC_PN diodes with reduced reverse leakage and mitigated Vf deterioration. The present technique can similarly be utilized for body diodes in MOSFETs.

Figure 12:
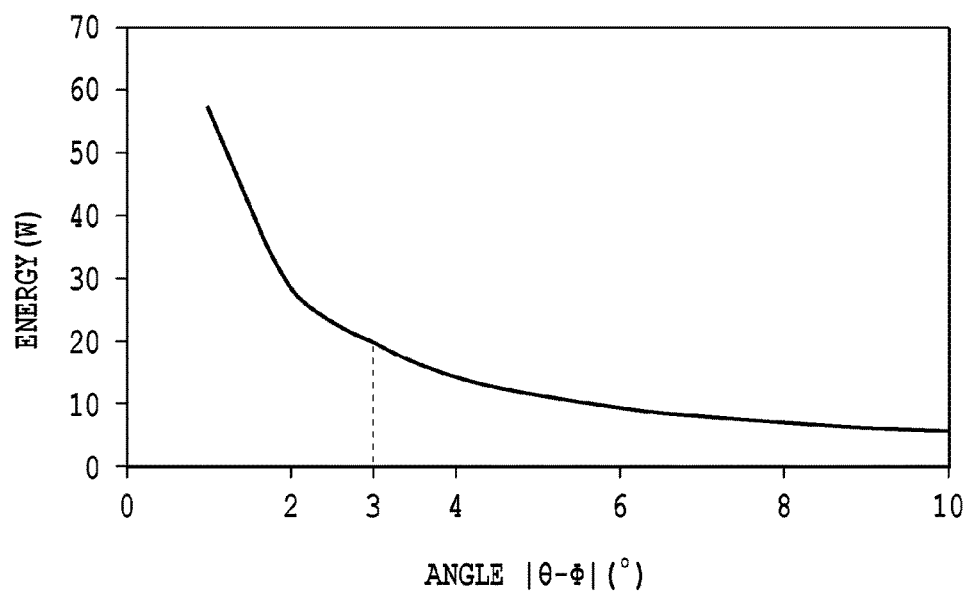
FIG. 12 is a diagram illustrating a relation between "elastic energy of BPD" and "an angle between a basal plane of the SiC substrate and a texture surface" according to an example of the present invention.

FIG. 12 is a graph illustrating a relation between "elastic energy of the BPD" and "the angle between the basal plane of the SiC substrate and the texture surface" according to an embodiment of the present invention. The axis of ordinate represents elastic energy W needed to linearly grow the BPD when the elastic energy of an extended defect in Expression (1) has a value of 1. The axis of abscissas represents the angle |θ−φ| (°) between the basal plane of the SiC substrate and the texture surface.

The graph indicates that when the angle |θ−φ| between the basal plane and the texture surface is 3° or less, the elastic energy W rapidly increases to hinder the growth of the BPD in the epitaxial layer. Therefore, the angle |θ−φ| between the basal plane and the texture surface set to 3° or less enables a reduction in defects resulting from the BPD in the epitaxial layer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions. All of the patent applications and documents cited herein are incorporated herein by reference in their entirety.

What is claimed is:

1. A method of manufacturing semiconductor, comprising:
   periodically forming textures, each texture being arranged along a direction perpendicular to a <−1100> direction of an SiC substrate, and having a first inclination surface that has an inclination angle φ to a front surface of the SiC substrate, wherein an angle between a basal plane of the SiC substrate and the first inclination surface of said each texture is smaller than an off angle θ, and the angle |θ−φ| between the basal plane and the first inclination surface of said each texture is 3° or less; and
   depositing an epitaxial film on the SiC substrate.

2. The method according to claim 1, wherein said each texture is formed by bringing a processing tool having a surface coat layer on a front surface of the processing tool into contact with the SiC substrate and reciprocating the processing tool in the <−1100> direction of the SiC substrate.

3. The method according to claim 1, wherein a pitch in a direction perpendicular to the <−1100> direction of the SiC substrate is 200 nm or less.

4. The method according to claim 1, wherein said each texture is a line pattern-like texture.

5. The method according to claim 1, wherein the periodically forming textures includes forming the textures each having the first inclination surface and a second inclination surface, when a valley angle subtended between the first and second inclination surfaces of each said texture is denoted as ψ, the valley angle ψ, satisfies:

$$\psi = 90° + |\theta - \phi|.$$

6. The method according to claim 2, wherein the surface coat layer is one of Pt, Ir, Re, Pd, Rh, Os, Au, and Ag.

7. An SiC substrate, comprising:
   a front surface on which an epitaxial film is deposited; and
   textures formed on the front surface, each texture being arranged along a direction perpendicular to a <−1100> direction of the SiC substrate and having a first inclination surface that has an inclination angle φ to a front surface of the SiC substrate, wherein an angle between a basal plane of the SiC substrate and the first inclination surface of the formed texture is smaller than an off angle θ, and the angle |θ−φ| between the basal plane and said each texture is 3° or less.

8. The SiC substrate according to claim 7, wherein a pitch of adjacent two textures in the direction perpendicular to the <−1100> direction of the SiC substrate is 200 nm or less.

9. The SiC substrate according to claim 7, wherein, said each texture has a second inclination surface, and when a valley angle subtended between first and second inclination surfaces of each said texture is denoted as $\psi$, the valley angle $\psi$ satisfies:

$$\psi = 90° + |\theta - \phi|.$$

10. The SiC substrate according to claim 7, wherein said each texture is a line pattern-like texture.

* * * * *